United States Patent [19]
Izumi

[11] Patent Number: 5,993,539
[45] Date of Patent: Nov. 30, 1999

[54] METHOD FOR PULLING A SINGLE CRYSTAL

[75] Inventor: Teruo Izumi, Amagasaki, Japan

[73] Assignee: Sumitomo Metal Industries, Ltd., Osaka, Japan

[21] Appl. No.: 09/019,982

[22] Filed: Feb. 6, 1998

[51] Int. Cl.⁶ .................................................. C30B 15/20
[52] U.S. Cl. ................................................................ 117/13
[58] Field of Search ................................. 117/13, 14, 15

[56] References Cited

U.S. PATENT DOCUMENTS

| | | | |
|---|---|---|---|
| 5,126,113 | 6/1992 | Yamagishi et al. | 422/249 |
| 5,173,270 | 12/1992 | Kida et al. | |
| 5,183,528 | 2/1993 | Baba et al. | |
| 5,196,086 | 3/1993 | Kida et al. | |
| 5,578,284 | 11/1996 | Chandrasekhar et al. | 423/348 |

FOREIGN PATENT DOCUMENTS 5-43379  2/1993  Japan .
8-319192  12/1996  Japan .

*Primary Examiner*—Felisa Hiteshew
*Attorney, Agent, or Firm*—Wenderoth, Lind & Ponack, L.L.P.

[57] ABSTRACT

In a conventional method for pulling a single crystal, a neck having a smaller diameter has been formed in order to exclude dislocation induced in dipping a seed crystal into a melt. However, in pulling a heavy single crystal having a large diameter of 12 inches or more, the single crystal cannot be supported and falls. When the diameter of the neck is large enough to prevent the fall, the dislocation cannot be excluded and propagates to the single crystal. In the present invention, when the distance between the lowest end of the seed crystal and the melt is 10–100 mm, the seed crystal is caused to stop descending and is preheated. Then, by bringing the seed crystal into contact with the melt at a gradually decreased descent speed, dislocation is not induced to the single crystal and the single crystal is formed without a neck.

5 Claims, 4 Drawing Sheets

(a)

(b)

(c)

(d)

(a)

(b)

(c)

(d)

METHOD FOR PULLING A SINGLE CRYSTAL

BACKGROUND OF THE INVENTION

1. Field of the Invention

The present invention relates to a method for pulling a single crystal and, more particularly, to a method for pulling a single crystal wherein a single crystal of silicon or the like is pulled from a melt of a material for forming a single crystal by a pulling method such as the Czochralski method (hereinafter, referred to as the CZ method).

2. Description of the Related Art

At present, the majority of silicon single crystals used for manufacturing a substrate for forming a circuit component of a LSI (large scale integrated circuit) and the like have been pulled by the CZ method. FIG. 1 is a diagrammatic sectional view of an apparatus for pulling a single crystal used for the CZ method, and in the figure, reference numeral 21 represents a crucible.

The crucible 21 comprises a bottomed cylindrical quartz crucible 21a and a bottomed cylindrical graphite crucible 21b fitted on the outer side of the quartz crucible 21a. The crucible 21 is supported with a support shaft 28 which rotates in the direction shown by the arrow A in the figure at a prescribed speed. A heater 22 of a resistance heating type and a heat insulating material 27 arranged around the heater 22 are concentrically arranged around the crucible 21. The crucible 21 is charged with a melt 23 of a material for forming a crystal which is melted by the heater 22. On the central axis of the crucible 21, a pulling axis 24 made of a pulling rod or wire is suspended, and at the front thereof, a seed crystal 25 is held by a holder 24a. These parts are arranged within a water cooled type chamber 29 wherein pressure can be controlled.

A method for pulling a single crystal 26 using the above-mentioned apparatus for pulling a single crystal is described below by reference to FIGS. 1 and 2. FIGS. 2(a)–(d) are partial magnified front views diagrammatically showing the seed crystal and the vicinity thereof in each step in pulling a single crystal.

Although it is not shown in FIG. 2, an inert gas is induced into the chamber 29 so as to make an inert gas atmosphere under reduced pressure, and then, the material for forming a crystal is melted by the heater 22. The situation is maintained for a period of time so as to sufficiently release gas contained in the melt 23.

While the pulling axis 24 is rotated on the same axis in the reverse direction of the support shaft 28 at a prescribed speed, the seed crystal 25 held by the holder 24a is caused to descend and is brought into contact with the melt 23 so as to make the seed crystal 25 partially melt into the melt 23. Then, the pulling of the single crystal 26 is started (hereinafter, referred to as the seeding step) (FIG. 2(a)).

In making a single crystal grow at the front of the seed crystal 25, the pulling axis 24 is pulled away from the melt at a higher speed than the below-described pulling speed in forming a main body 26c. The crystal is narrowed down to have a prescribed diameter, leading to the formation of a neck 26a (hereinafter, referred to as the necking step) (FIG. 2(b)).

By slowing down the pulling speed of the pulling axis 24 (hereinafter, simply referred to as the pulling speed), the neck 26a is made to grow to have a prescribed diameter, leading to the formation of a shoulder 26b (FIG. 2(c)).

By pulling the pulling axis 24 at a fixed rate, the main body 26c having a uniform diameter and a prescribed length is formed (FIG. 2(d)).

Although it is not shown in FIG. 2, in order to prevent induction of high density dislocation to the single crystal 26 by a steep temperature gradient in the last stage, the diameter thereof is gradually decreased and the temperature of the whole single crystal 26 is gradually lowered, leading to the formation of an end-cone. Then, the single crystal 26 is separated from the melt 23 and is cooled, which is at the end of the pulling of the single crystal 26.

One of the most important steps in the pulling of the single crystal 26 is the above-mentioned necking step (FIG. 2(b)). The object of the necking step is described below. Before the seeding step (FIG. 2(a)), the seed crystal 25 is caused to once stop immediately above the melt 23, is preheated by the melt 23, and is then brought into contact with the melt 23. There is usually a difference of 100° C. or more between the temperature of the seed crystal 25 after preheating (about 1300° C. and less) and the melting point of the seed crystal 25 (about 1410° C.). Therefore, when the seed crystal 25 is brought into contact with the melt 23, the seed crystal 25 has a steep temperature gradient, leading to the induction of the dislocation caused by a thermal stress to the lower portion 25b of the seed crystal 25. It is necessary to make the single crystal 26 grow after excluding the dislocation which inhibits single crystal growth. Since the dislocation generally grows in the vertical direction to the growth interface of the single crystal 26, the shape of the growth interface (the front plane of the neck 26a) is made to be downward convex in the necking step, so as to exclude the dislocation outward.

In the necking step, the faster the pulling speed, the smaller the diameter of the neck 26a becomes and the more downward convex the shape of the growth interface becomes. As a result, the dislocation can be inhibited from propagating and can be efficiently excluded.

In the above conventional method for pulling a single crystal, the seed crystal 25 having a diameter of about 12 mm has been generally used in order to pull the single crystal 26 having a diameter of about 6 inches and a weight of 80 kg or so. The larger the diameter of the neck 26a, the more safely the single crystal 26 is held, while the smaller the diameter of the neck 26a, the more efficiently the dislocation is excluded. In order to meet both of the requirements, the neck 26a having a diameter of about 3 mm has been selected. Recently, however, in order to manufacture a more highly integrated semiconductor device at a lower cost and more efficiently, the wafer has been required to have a larger diameter. Now, for example, the production of the single crystal 26 having a diameter of about 12 inches (300 mm) and a weight of 300 kg or so is desired. In this case, the neck 26a having a conventional diameter (usually 3 mm or so) cannot withstand the weight of the pulled single crystal 26 and breaks, resulting in the falling of the single crystal 26.

In growing the above heavy single crystal 26, the diameter of the neck 26a needs to be about 6 mm or more, in order to prevent the occurrence of troubles, such as a fall of the single crystal 26 and to pull the single crystal 26 safely, which diameter is calculated from the silicon strength (about 16 kgf/mm$^2$). However, when the diameter of the neck 26a is 6 mm or more, the dislocation induced in dipping the seed crystal 25 into the melt 23 cannot be sufficiently excluded using known methods.

SUMMARY OF THE INVENTION

The present invention was developed in order to solve the above problems. It is an object of the present invention to provide a method for pulling a single crystal, wherein dislocation is not induced to a seed crystal itself when the seed crystal is dipped into a melt so as to make a single crystal grow, so that the necking step can be omitted and a heavy single crystal can be pulled safely and at low cost.

In order to achieve the above object, a method for pulling a single crystal (1) is provided, wherein a single crystal is grown by causing a seed crystal to descend and to dip into a melt within a crucible and then, pulling the seed crystal from the melt, which method is characterized by causing the seed crystal to once stop descending above the melt so as to preheat the seed crystal, wherein the distance between the lowest end of the seed crystal and the surface of the melt is 10–100 mm, bringing the seed crystal into contact with the melt at a gradually decreasing descent speed, and pulling the single crystal from the melt without forming a neck.

In the method for pulling a single crystal (1), since the descent speed of the seed crystal is gradually decreased as the seed crystal approaches the melt, the temperature of the seed crystal can be raised close to that of the melt before dipping the seed crystal into the melt, leading to the prevention of the induction of dislocation caused by a thermal shock in dipping the seed crystal into the melt. As a result, the single crystal can be pulled from the melt without propagating the dislocation, even if no neck is formed. Even when a heavy single crystal is pulled, the single crystal is sufficiently supported. Since a neck need not be formed, the size of the whole seed crystal can be smaller than that used in the conventional method. As a result, an inexpensive seed crystal can be used, and the cost of pulling a single crystal can be reduced.

A method for pulling a single crystal (2) according to the present invention is also provided, which is carried out according to the method for pulling a single crystal (1), and which is further characterized by decreasing the descent speed by stages within the range of 4.0–0.1 mm/min.

In the method for pulling a single crystal (2), in addition to the effect in the method for pulling a single crystal (1), the seed crystal can be heated in a relatively short period of time and be brought into contact with the melt, so that the single crystal can be pulled efficiently in a short period of time.

DETAILED DESCRIPTION OF THE PREFERRED EMBODIMENTS

The method for pulling a single crystal according to the present invention is described below. The method for pulling a single crystal is described based on the assumption that a heavy single crystal having a large diameter of 12 inches or more is pulled.

Figure 1:
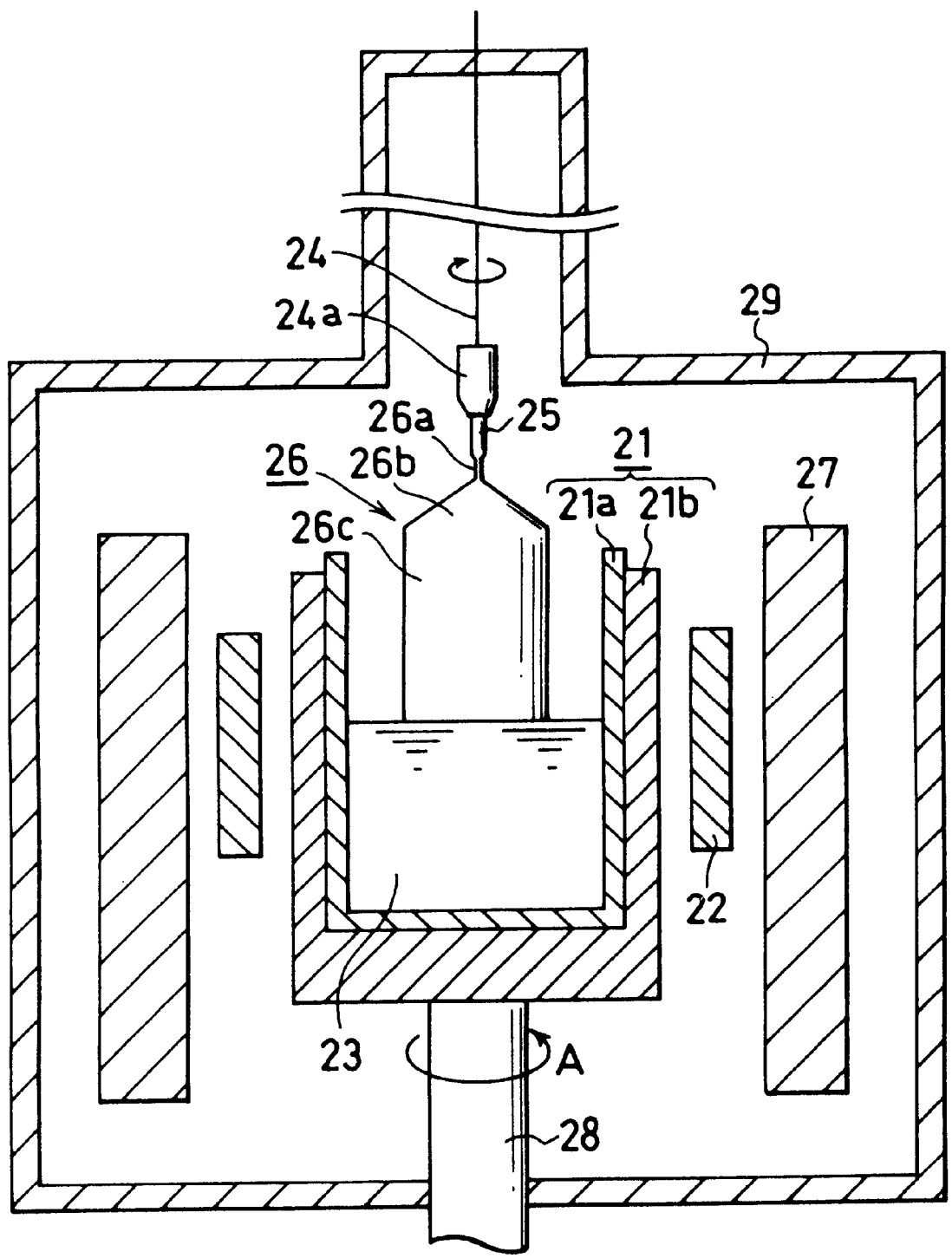
FIG. 1 is a diagrammatic sectional view showing an apparatus for pulling a single crystal used for the CZ method.

In the method for pulling a single crystal according to the invention, the same apparatus for pulling a single crystal as that shown in FIG. 1 is used, therefore, the description of the apparatus is omitted here and only the method for pulling a single crystal according to the invention is described.

FIGS. 3(a)–(d) are partial magnified front views diagrammatically showing a seed crystal and the vicinity thereof in each step in the method for pulling a single crystal according to the invention.

The steps before the below-described steps are carried out in the same manner as described in the Prior Art.

Figure 3:
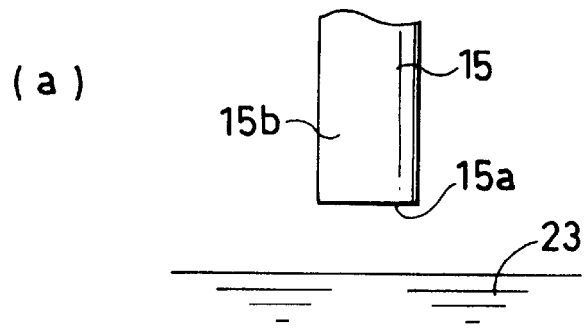
FIGS. 3(a)–(d) are partial magnified front views diagrammatically showing a seed crystal and the vicinity thereof in each step in the method for pulling a single crystal according to the present invention.
Figure 3:
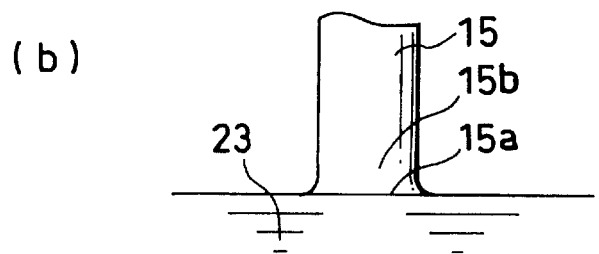
Figure 3:
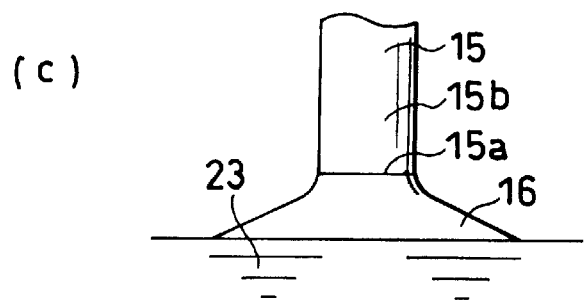
Figure 3:
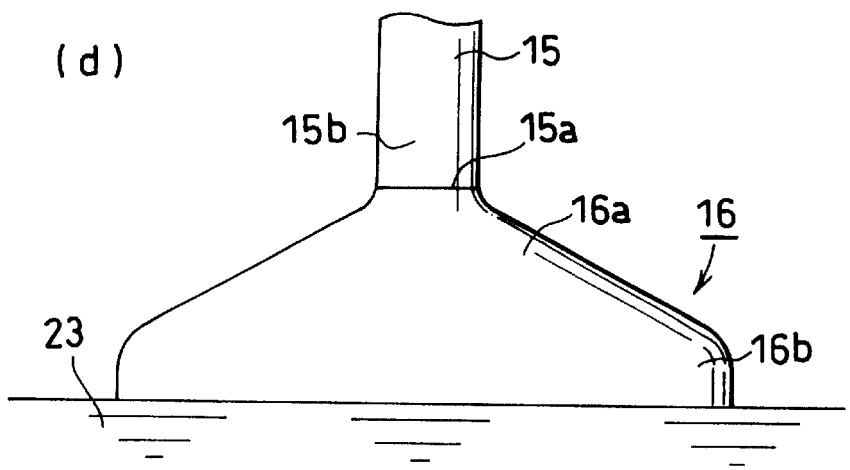

While a pulling axis 24 is rotated on the same axis in the reverse direction of a support shaft 28 at a prescribed speed, the seed crystal 15 held by a holder 24a is caused to descend at a conventional speed, which is high to some extent until the lowest end 15a of the seed crystal 15 is 10–100 mm above the surface of the melt 23, where it is caused to stop descending, preferably only once, so as to be preheated (FIG. 3(a)).

By this preheating, the temperature of the lower portion 15b of the seed crystal 15 is raised to 1200–1300° C. or so.

When the seed crystal 15 is caused to further descend from the preheating position shown in FIG. 3(a), the descent speed is gradually decreased as the seed crystal 15 approaches the melt 23. After the temperature of the lower portion 15b of the seed crystal 15 is sufficiently raised close to that of the melt 23, the seed crystal 15 is brought into contact with the melt 23 (FIG. 3(b)).

The descent speed of the seed crystal 15 may be decreased either by stages or continuously. The range of the descent speed is preferably 4.0–0.1 mm/min, though it depends on the diameter of the seed crystal 15. By controlling the relationship between the distance from the melt 23 to the lowest end 15a of the seed crystal 15 and the descent speed, the temperature of the lower portion 15b of the seed crystal 15 can be raised to almost the same temperature as that of the melt 23 in a short period of time.

When the period of time from the end of preheating to the contact with the melt is too short, it is difficult to make the temperature of the lower portion 15b of the seed crystal 15 gradually rise close to that of the melt 23. On the other hand, when the period time of from the end of preheating to the contact with the melt is too long, the temperature of the lower portion 15b of the seed crystal 15 can be raised sufficiently slowly, but a single crystal 16 cannot be pulled efficiently.

Figure 2:
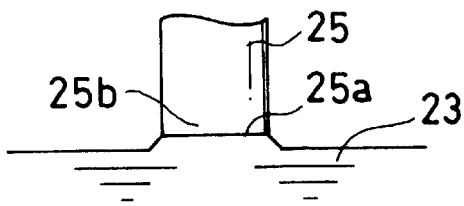
FIGS. 2(a)–(d) are partial magnified front views diagrammatically showing a seed crystal and the vicinity thereof in each step in a conventional method for pulling a single crystal.
Figure 2:
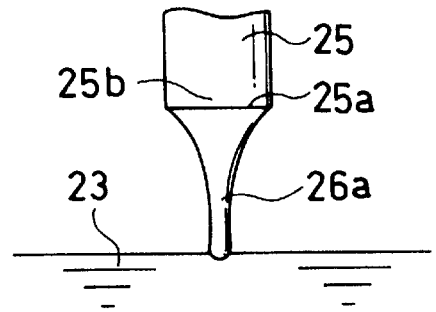
Figure 2:
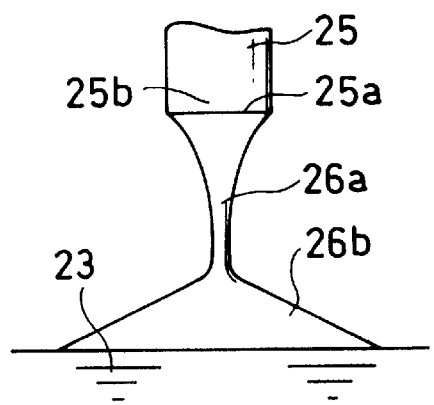
Figure 2:
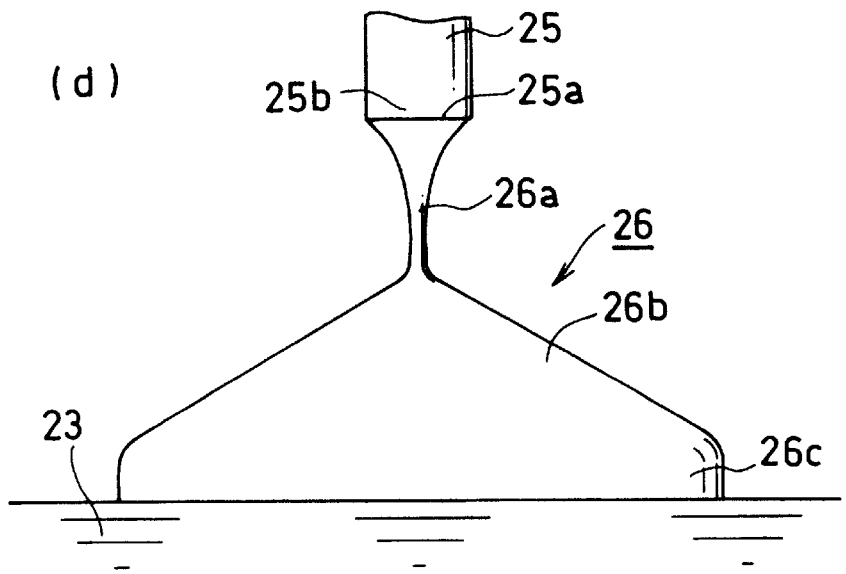

By controlling the descent speed of the seed crystal 15 as described above, the difference between the temperature of the seed crystal 15 and that the temperature of the melt 23 in contact with the seed crystal can be made small. As a result, a thermal stress caused by the temperature difference is prevented from effecting the seed crystal 15, so that induction of dislocation can be inhibited. Therefore, a neck 26a (FIG. 2) need not be formed, and a shoulder 16a can be formed immediately by pulling the seed crystal 15 at a prescribed speed (FIG. 3(c)).

The seed crystal 15 is pulled at a prescribed pulling speed, leading to the formation of a main body 16b (FIG. 3(d)).

Then, the single crystal 16 is pulled in the same manner as described in the Prior Art, is separated from the melt 23 and is cooled, which is at the end of the pulling of the single crystal 16.

EXAMPLES AND COMPARATIVE EXAMPLES

The method for pulling a single crystal according to the invention is described below in the Examples. As a comparison, the case wherein a single crystal was pulled by a conventional method shown in FIG. 2 and the case wherein the descent speed of a seed crystal was not controlled sufficiently are described below in the comparative Examples. The conditions under which these tests were conducted are shown in Tables 1–6.

TABLE 1

(Common conditions to Examples and Comparative Examples)

Shape of single crystal

| Diameter (mm) | Length (mm) | Weight (kg) | Material Weight (kg) | Number of pulls (times) |
|---|---|---|---|---|
| 300 (12 in) | 1000 | 270 | 300 | 10 |

TABLE 2

(Common conditions to Examples and Comparative Examples)

| Revolution speed (rpm) | | Conditions in chamber | |
|---|---|---|---|
| Crystal | Crucible | Flow of Ar (liter/min) | Pressure (Pa) |
| 20 | 5 | 80 | 1330 |

TABLE 3

(Common conditing to Examples and Comparative Examples)

| Preheating conditions | Distance between seed crystal lower end and melt surface (mm) | time (min) |
|---|---|---|
| | 40 | 30 |

TABLE 4

(Different conditions between Examples and Comparative Examples)

Figure 4:
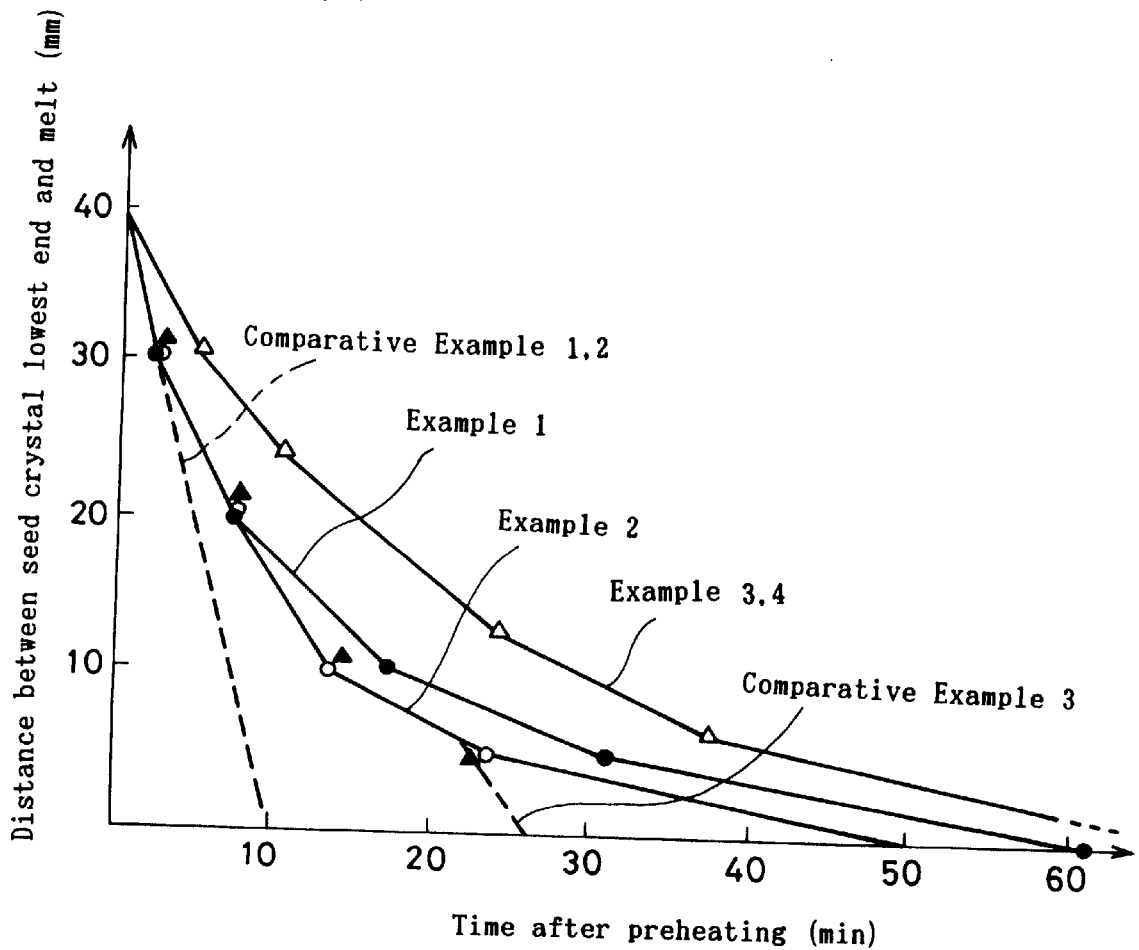
FIG. 4 is a graph wherein the axis of abscissas indicates the lapse of time after preheating, while the axis of ordinates indicates the distance between the lowest end of the seed crystal and the melt in Examples and Comparative Examples.

| | seed crystal diameter (mm) | Relationship between time after preheating and distance from seed crystal lower end to melt surface (mm) |
|---|---|---|
| Examples 1–3 | 10 | See FIG. 4 |
| Example 4 | 6 | See FIG. 4 |
| Comparative Examples 1 and 2 | 12 | See FIG.4 (descent speed: 4 mm/min) |
| Comparative Example 3 | 10 | See FIG. 4 |

TABLE 5

| | Pulling speed in formation of each part (mm/min) | | |
|---|---|---|---|
| | neck | Shoulder | Main body |
| Examples 1–4 | — | 0.3 | 0.5 |
| Comparative Example 1 | 3 | 0.3 | 0.5 |
| Comparative Example 2 | 4 | 0.3 | 0.5 |
| Comparative Example 3 | — | 0.3 | 0.5 |

TABLE 6

| | Smallest diameter of neck (m) |
|---|---|
| Examples 1–4 | No neck formed |
| Comparative Example 1 | 4 |
| Comparative Example 2 | 10 |
| Comparative Example 3 | No neck formed |

<How to Examine DF (Dislocation Free) Rate of Pulled Single Crystals>

The pulled single crystals 16 or 26 were sliced in parallel to the growth direction (length direction), and X-ray topographies of the obtained single crystals 16 or 26 were measured, from which the DF rate was judged. That is, the single crystals 16 or 26, in which dislocation was found even slightly from the X-ray topographies, were judged as having dislocation. The rate of dislocation-free single crystals (DF) in ten pulled single crystals was examined by the above measurement.

<Results of Examples 1–4 and Comparative Examples 1–3>

The DF rates and the number of falls of the single crystals 16 and 26 according to Examples 1–4 and Comparative Examples 1–3 are shown in Table 7.

TABLE 7

| | DF rate (%) | Ratio of falls |
|---|---|---|
| Example 1 | 70% (7/10) | 0 (0/10) |
| Example 2 | 60% (6/10) | 0 (0/10) |
| Example 3 | 80% (8/10) | 0 (0/10) |
| Example 4 | 90% (9/10) | 0 (0/10) |
| Comparative Example 1 | 90% (9/10) | 8 (8/10) |
| Comparative Example 2 | 0% (0/10) | 0 (0/10) |
| Comparative Example 3 | 0% (0/10) | 0 (0/10) |

As is obvious from the results shown in Table 7, in Examples 1–4, the DF rates of the pulled single crystals 16 were 70% (7/10), 60% (6/10), 80% (8/10). and 90% (9/10), respectively, even though the single crystals 16 were pulled without forming a neck 26a (FIG. 2), since dislocation was not induced to the seed crystals 15. Since the diameters of the lower portions 15b of the seed crystals 15 were 10 mm or 6 mm, which were sufficiently large, the ratio of falls was 0/10 in all cases.

On the other hand, in Comparative Example 1, since the diameters of the necks 26a were narrowed down to be 4 mm, the DF rate was favorably 90% (9/10). The single crystals 26 could not be supported sufficiently, therefore, the ratio of falls was 8/10, which was large. In Comparative Example 2, since the diameters of the necks 26a were 10 mm, which were large, the ratio of falls was 0/10. But since the dislocation induced to the seed crystals 25 could not be excluded, the DF rate was 0% (0/10). In Comparative Example 3, the seed crystals 25 were preheated and the descent speed thereof was gradually decreased part of the way. The descent speed thereof was not sufficiently controlled in the vicinity immediately above the melt, therefore, dislocation was induced to the seed crystals 25, and since no neck 26a (FIG. 2) was formed, propagation of the dislocation could not be prevented. As a result, the dislocation was found in all of the pulled single crystals.

What is claimed is:

1. A method for pulling a single crystal, comprising causing a seed crystal to descend and to dip into a melt within a crucible, and pulling the seed crystal from the melt to make a single crystal, wherein during the descent of the seed crystal, the decent of the seed crystal is stopped above the melt to preheat the seed crystal, wherein the distance between the lowest end of the seed crystal and the surface of the melt is 10–100 mm, and then, the seed crystal is descended at a gradually decreasing descent speed and is brought into contact with the melt, and the single crystal is pulled from the melt without forming a neck.

2. The method for pulling a single crystal according to claim 1, wherein the descent speed of the seed crystal is decreased within the range of 4.0–0.1 mm/min before contacting the melt.

3. The method for pulling a single crystal according to claim 1, wherein when the decent of the seed crystal is stopped above the melt, the seed crystal is preheated by the heat rising from the melt.

4. The method for pulling a single crystal according to claim 1, wherein the lower portion of the seed crystal is heated to a temperature between about 1200–1300° C.

5. The method for pulling a single crystal according to claim 1, wherein the gradual decreasing descent speed causes the temperature of the lower portion of the seed crystal to rise to a temperature about the same as the temperature of the melt.

* * * * *